United States Patent
Fisher et al.

(10) Patent No.: US 6,542,377 B1
(45) Date of Patent: Apr. 1, 2003

(54) PRINTED CIRCUIT ASSEMBLY HAVING CONDUCTIVE PAD ARRAY WITH IN-LINE VIA PLACEMENT

(75) Inventors: Doreen S. Fisher, Georgetown, TX (US); Thad McMillan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 09/605,905

(22) Filed: Jun. 28, 2000

(51) Int. Cl.[7] .............................................. H05K 7/02
(52) U.S. Cl. ...................... 361/777; 361/767; 361/778; 257/774; 257/775; 174/259; 174/261
(58) Field of Search ................................ 361/777, 760, 361/767, 778, 761; 257/686, 774, 775, 700, 786; 365/52; 174/259, 261, 265, 266, 262

(56) References Cited

U.S. PATENT DOCUMENTS

| | | | |
|---|---|---|---|
| 3,859,711 A | * | 1/1975 | McKiddy ...................... 29/593 |
| 4,285,780 A | * | 8/1981 | Schachter ...................... 204/15 |
| 5,450,290 A | * | 9/1995 | Boyko et al. ............... 174/260 |
| 5,459,287 A | * | 10/1995 | Swamy ........................ 174/266 |
| 5,477,082 A | * | 12/1995 | Buckley et al. ............. 257/679 |
| 5,530,288 A | * | 6/1996 | Stone .......................... 257/700 |
| 5,558,928 A | * | 9/1996 | Distefano et al. ........... 428/209 |
| 5,585,162 A | | 12/1996 | Schueller |
| 5,706,178 A | | 1/1998 | Barrow |
| 5,784,262 A | * | 7/1998 | Sherman ..................... 174/261 |
| 5,796,589 A | | 8/1998 | Barrow |
| 5,812,379 A | | 9/1998 | Barrow |
| 5,875,102 A | | 2/1999 | Barrow |
| 5,972,734 A | | 10/1999 | Carichner et al. |
| 6,050,832 A | * | 4/2000 | Lee et al. ...................... 439/66 |
| 6,137,709 A | * | 10/2000 | Boaz et al. .................... 365/51 |
| 6,144,576 A | * | 11/2000 | Leddige et al. ............... 365/63 |
| 6,201,194 B1 | * | 3/2001 | Lauffer et al. .............. 174/264 |
| 6,373,139 B1 | * | 4/2002 | Clark .......................... 257/737 |

* cited by examiner

Primary Examiner—David Martin
Assistant Examiner—Hung Bui
(74) Attorney, Agent, or Firm—Haynes and Boone, LLP

(57) ABSTRACT

A computer system including a microprocessor and a system memory coupled t provide storage to facilitate execution of computer programs by the microprocessor. An input is coupled to provide input to the microprocessor. A display is coupled to the microprocessor by a video controller and a mass storage is coupled to the microprocessor. A printed circuit board is electrically coupled to the microprocessor. The printed circuit board includes a circuit substrate having two spaced apart major surfaces and a plurality of rows of interconnect assemblies. Each row of interconnect assemblies includes a first and a second interconnect pad on a major surface of the circuit substrate. The first and the second interconnect pads are positioned on a respective reference axis. The first interconnect pad is spaced apart from the second interconnect pad by a first distance. A first and a second conductive via extend through the circuit substrate. The first and the second conductive vias are positioned adjacent to and electrically connected to respective ones of the interconnect pads. Each one of the conductive vias is positioned on the respective reference axis and is spaced apart from the respective interconnect pad by a second distance. The first distance is substantially greater than the second distance wherein each conductive via is offset toward the connected interconnect pad.

17 Claims, 4 Drawing Sheets

PRINTED CIRCUIT ASSEMBLY HAVING CONDUCTIVE PAD ARRAY WITH IN-LINE VIA PLACEMENT

BACKGROUND

The disclosures herein relate generally to computer systems and more particularly to a printed circuit assembly having a conductive pad array with in-line via placement. Printed circuit assemblies such as rigid printed circuit boards and flexible printed circuits, are widely used components in all types of electronic devices. For example, printed circuit assemblies are commonly used as motherboards or other types of system boards in computer systems. Printed circuit assemblies provide for dense routing of electrical signals and power, and are relatively inexpensive to fabricate.

The size of electronic components continues to decrease and circuit routing densities continue to increase. Accordingly, it is necessary to increase the density of printed circuit assembly components, such as interconnect pads, conductive vias, and traces. Increasing the density of the printed circuit assembly components requires spacing such components closer together without increasing the occurrence of short circuits between adjacent printed circuit assembly components.

U.S. Pat. No. 5,875,102 discloses a ball grid array integrated circuit package which has a plurality of conductive vias connected to a plurality of solder pads located on a bottom surface of a package substrate. Each conductive via has a portion located within a solder pad to increase the routing space of the substrate, and a portion located outside the solder pad to allow outgassing from the conductive via. The bottom surface also has a solder mask which covers the conductive vias and contains a number of holes that expose the solder pads. The holes allow solder balls to be connected to the solder pads. The solder balls can be reflowed to attach the package to a printed circuit board. This type of package configuration increases routing space, but is relatively expensive to fabricate.

U.S. Pat. No. 5,706,178 discloses a ball grid array integrated circuit package which has a plurality of elliptically shaped solder pads located on a bottom surface of a package substrate. The bottom surface also has a solder mask which contains a number of holes that expose the solder pads. The holes allow solder balls to be attached to the solder pads. The solder balls can be reflowed to attach the package to a printed circuit board. The elliptically shaped solder pads have a width that is smaller than the length of the pads. The narrow width portion of each solder pad provides additional routing space on the bottom surface of the package. The solder mask hole diameters are less than the length of the solder pads so that portions of the solder pads are anchored beneath the solder mask. The anchored portions of the solder pads increase the solder pad peel strength.

U.S. Pat. No. 5,585,162 discloses a flexible circuit construction that allows solder balls to be mass reflow attached to the ground plane of a double-sided flexible circuit. The circuit includes a first conductive via which is separate from the remainder of the ground plane. The first conductive via is electrically connected to the ground plane through a second conductive via. The second conductive via is positioned at a distance from the first conductive via by a circuit trace on the side of the flexible circuit opposite the ground plane.

In high density printed circuit assemblies, the distance between one printed circuit assembly component relative to another is decreased. By rearranging selected printed circuit assembly components, additional space between such selected components is provided. The additional space can be used for adding more printed circuit assembly components such as interconnect pads and conductive vias, or for routing additional traces or larger traces between the selected components.

Conventional printed circuit assemblies that provide additional trace routing space are known and are discussed herein below. These conventional printed circuit assemblies provide additional routing space at the expense of reliability and manufacturability. Each conductive via and adjacent non-connected interconnect pad are susceptible to shorting during reflow of a connected interconnect element, such as a solder ball. In some of these conventional printed circuit assemblies, each conductive via is centered between two interconnect pads. Because of the close proximity of each conductive via relative to the adjacent non-connected interconnect pad, the potential exists for one or more of the conductive vias to be inadvertently connected to the adjacent non-connected interconnect pad during a solder reflow operation.

Therefore, what is needed is a low-cost and reliable printed circuit assembly that provides additional space for routing wider traces or an increased number of traces through an array of conductive vias and interconnect pads.

SUMMARY

Accordingly, in one embodiment, a printed circuit assembly includes a conductive via that provides additional space for routing traces without sacrificing reliability or manufacturability. To this end, a printed circuit assembly includes a circuit substrate having spaced apart first and second major surfaces. A first and a second interconnect pad are spaced apart on the first major surface of the circuit substrate. The first and the second interconnect pads are positioned on a reference axis. The first interconnect pad is spaced apart from the second interconnect pad by a first distance. A first and a second conductive via extend through the circuit substrate between the first and the second major surfaces. The first and the second conductive vias are positioned adjacent to and electrically connected to respective ones of the interconnect pads. Each one of the conductive vias is positioned on the reference axis and is spaced apart from the respective interconnect pad by a second distance. The first distance is substantially greater than the second distance wherein each conductive via is offset toward the connected interconnect pad.

A principal advantage of this embodiment is that an array of conductive vias and an array of interconnect pads can be configured to provide increased space for routing traces therethrough.

BRIEF DESCRIPTION OF THE DRAWING FIGURES

DETAILED DESCRIPTION

Figure 1:
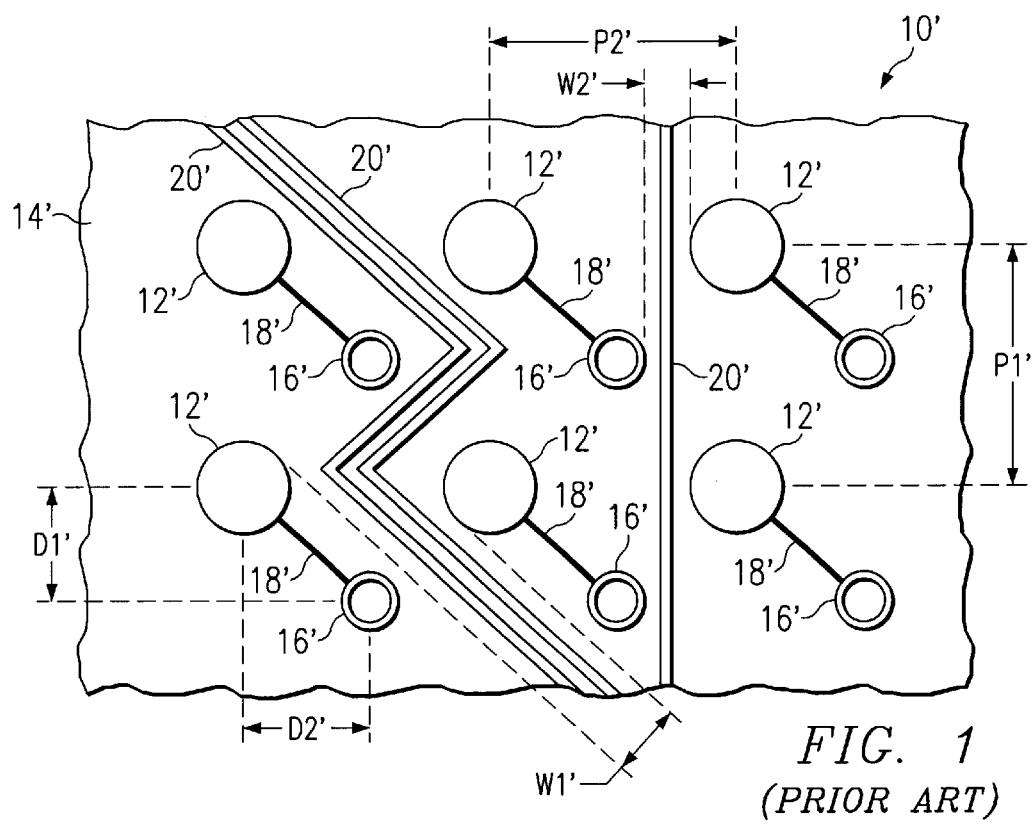
FIG. 1 is a plan view illustrating an embodiment of a conventional printed circuit assembly.

A first conventional printed circuit assembly 10', FIG. 1, includes an array of interconnect pads 12' on a surface of a printed circuit substrate 14' and an array of conductive vias 16' extending through the printed circuit substrate 14'. Each conductive via 16' is offset from each adjacent interconnect pad 12' in a first direction and in a second direction generally normal to the first direction. The arrays of interconnect pads 12' and conductive vias 16' have a first direction pitch P1' and second direction pitch P2'. The arrays of interconnect pads 12' and conductive vias 16' are typically offset by a first direction offset distance D1' and by a second direction offset distance D2' that is substantially equal to the first direction offset distance D1'. Accordingly, the first direction pitch P1' and the second direction pitch P2' are substantially the same.

An interconnect trace 18' connects each interconnect pad 12' with a respective one of the conductive vias 16'. One or more routing traces 20' are routed between the interconnect pads 12' and the conductive vias 16'. The routing traces 20' can be routed in a straight configuration or in a zig-zag configuration. A first trace routing width W1' is defined between adjacent interconnect pads 12', extending generally parallel to the interconnect traces 18'. A second trace routing width W2' is defined between each interconnect pad 12' and adjacent pairs of non-connected conductive vias 16'. The first trace routing width W1' is substantially greater than the second trace routing width W2'.

Figure 2:
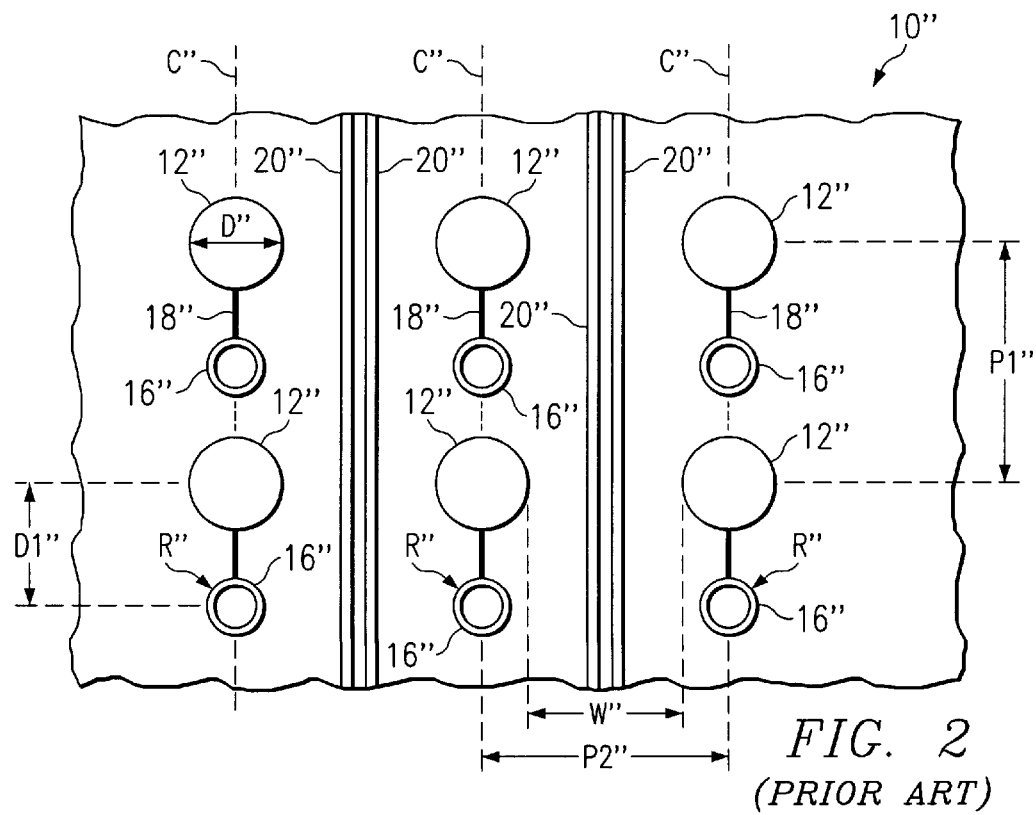
FIG. 2 is a plan view illustrating another embodiment of a conventional printed circuit assembly.

In many applications, such as when routing traces to RAMBUS™ memory modules offered by Rambus Incorporated, it is necessary to provide additional space for the routing traces 20'. The routing traces 20' for RAMBUS memory modules are typically about 18 mils wide whereas conventional routing traces are about 6 mils wide. A second conventional printed circuit assembly 10", FIG. 2, illustrates a printed circuit assembly configuration for providing additional space for routing a plurality of routing traces 20". The second conventional printed circuit assembly 10" includes an array of interconnect pads 12" and an array of conductive vias 16". Each interconnect pad 12" has an interconnect pad diameter D". Each conductive via 16" is offset from a connected interconnect pad 12" in only a first direction by a first direction offset distance D1". The arrays of interconnect pads 12" and conductive vias 16" have a first direction pitch P1" and a second direction pitch P2". The first direction pitch P1" and the second direction pitch P2" are typically the same, and the offset distance D1" is substantially one-half of the first direction pitch P1".

A plurality of rows R" of conductive vias 12" and interconnect pads 16" are spaced apart, defining a trace routing width W" therebetween. Each adjacent pair of interconnect pads 12" in each row R" has a conductive via 16" centered therebetween on a common axis C". The trace routing width W" is equal to the second direction pitch P2' minus the interconnect pad diameter D". Accordingly, relative to the routing widths W1' and W2' of the first conventional printed circuit assembly 10', FIG. 1, additional space is provided for routing a plurality of routing traces 20", FIG. 2. The additional space for routing results from each interconnect pad 12" and the connected conductive via 16" being aligned on the respective reference axis C".

The second conventional printed circuit assembly 10" provides additional trace routing space at the expense of reliability and manufacturability. Each conductive via 16" and the adjacent non-connected interconnect pad 12" in each row R" are susceptible to shorting during reflow of a connected interconnect element, such as a solder ball. Because each conductive via 16" is centered between two interconnect pads 12" and because of the close proximity of each conductive via 16" relative to the adjacent non-connected interconnect pad 12", the potential exists for one or more of the conductive vias 16" to be inadvertently connected to the adjacent non-connected interconnect pad 12" during a solder reflow operation.

Figure 3:
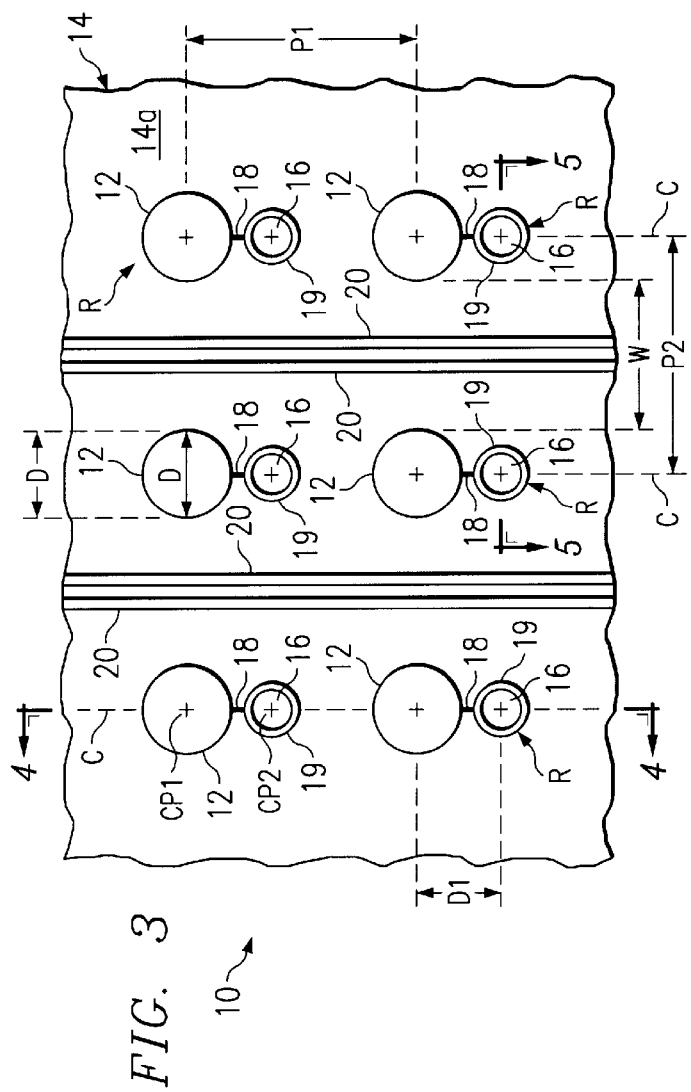
FIG. 3 is a plan view illustrating an embodiment of a printed circuit assembly having an array of conductive vias that is in-line and offset relative to an array of interconnect pads.
Figure 4:
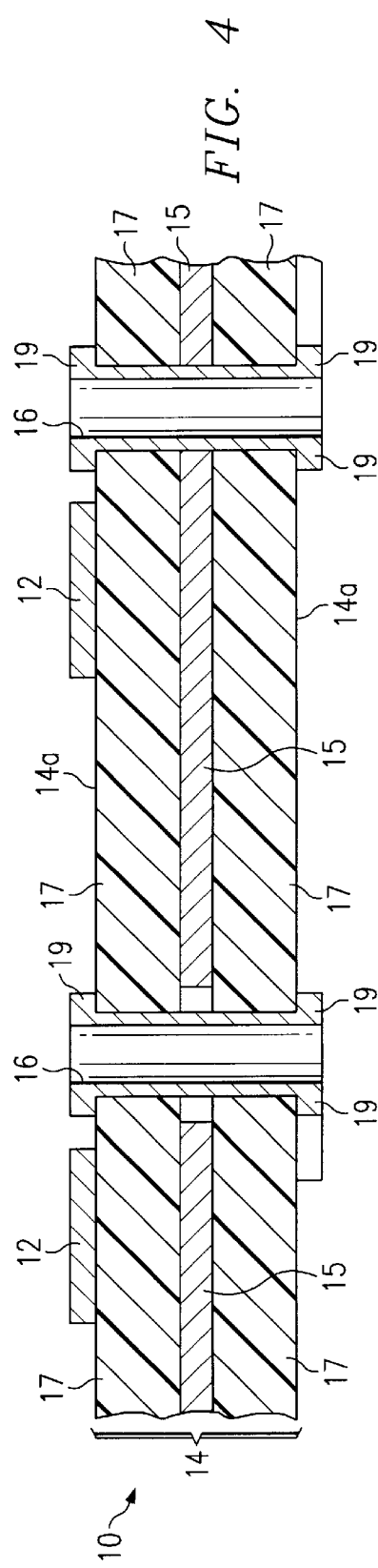
FIG. 4 is a cross sectional view taken along the line 4—4 in FIG. 3.
Figure 5:
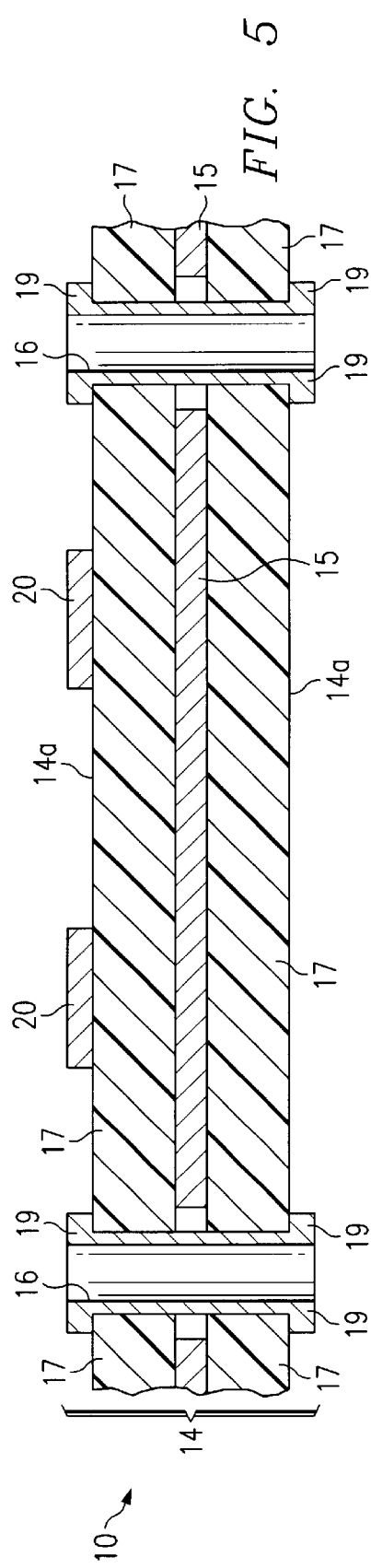
FIG. 5 is a cross sectional view taken along the line 5—5 in FIG. 3.

An embodiment of a printed circuit assembly 10 that provides a reduced potential for shorting and an increased space for the routing of traces is illustrated in FIGS. 3–5. The printed circuit assembly 10 includes an array of interconnect pads 12 attached to a major surface 14a of a circuit substrate 14 and an array of conductive vias 16 extending through the circuit substrate 14. Each interconnect pad 12 has an interconnect pad diameter D.

The circuit substrate 14, FIGS. 4 and 5, typically includes a plurality of conductive layers 15 having a dielectric layer 17 disposed between each adjacent pair of the conductive layers 15. At least one of the conductive layers 15 may be an interior conductive layer disposed between two adjacent dielectric layers 17. Interior conductive layers are commonly used as internal routing layers or as reference voltage planes. In some applications, one or more of the conductive vias 16 are electrically connected to one or more of the interior conductive layers.

Each conductive via 16 is electrically connected to one of the interconnect pads 12 by an interconnect trace 18. Each interconnect pad 12, connected conductive via 16 and respective interconnect trace 18 define an interconnect assembly. Each conductive via 16 is offset from a connected interconnect pad 12 in only a first direction by a first direction offset distance D1, FIG. 3. The arrays of interconnect pads 12 and conductive vias 16 have a first direction pitch P1 and a second direction pitch P2. The first direction pitch P1 and the second direction pitch P2 are substantially the same. In other embodiments (not shown), the first direction pitch P1 is different from the second direction pitch P2.

Each conductive via 16 includes a conductive land 19 on each major surface 14a of the circuit substrate 14. The interconnect pads 12 and the conductive lands 19 of each conductive via 16 preferably have a round shape. Each conductive land 19 is integrally formed with the respective conductive via 16.

A plurality of rows R of conductive vias 12 and interconnect pads 16, FIG. 3, are spaced apart to define a trace routing width W. The trace routing width W is equal to the second direction pitch P2 minus the interconnect pad diameter D. Each adjacent pair of interconnect pads 12 in each row R has a conductive via 16 positioned therebetween on a common axis C. Each interconnect pad 12 and each conductive via 16 has a generally round shape that defines a respective center point CP1, CP2 thereof. The center point CP1 of each interconnect pad 12 and the center point CP2 of each conductive via 16 are positioned on the respective reference axis C.

A key aspect of the printed circuit assembly 10 disclosed herein is that the offset distance D1 is substantially less than one-half of the first direction pitch P1. By offsetting each conductive via 16 closer to the connected interconnect pad 12, the potential for shorting between each conductive via 16 and the adjacent non-connected interconnect pad 12 is substantially reduced. The reduced potential for shorting improves initial yield rates and rework yield rates while still providing additional space for routing a plurality of routing traces 20.

The printed circuit assembly 10 typically has first and second direction pitches P1, P2, respectively, of about 50 mils, a conductive land diameter of about 25 mils and a solder mask clearance from each interconnect pad of about 2.5 mils. Accordingly, the trace routing width W of the printed circuit assembly 10 having such a configuration is about 25 mils.

Figure 6:
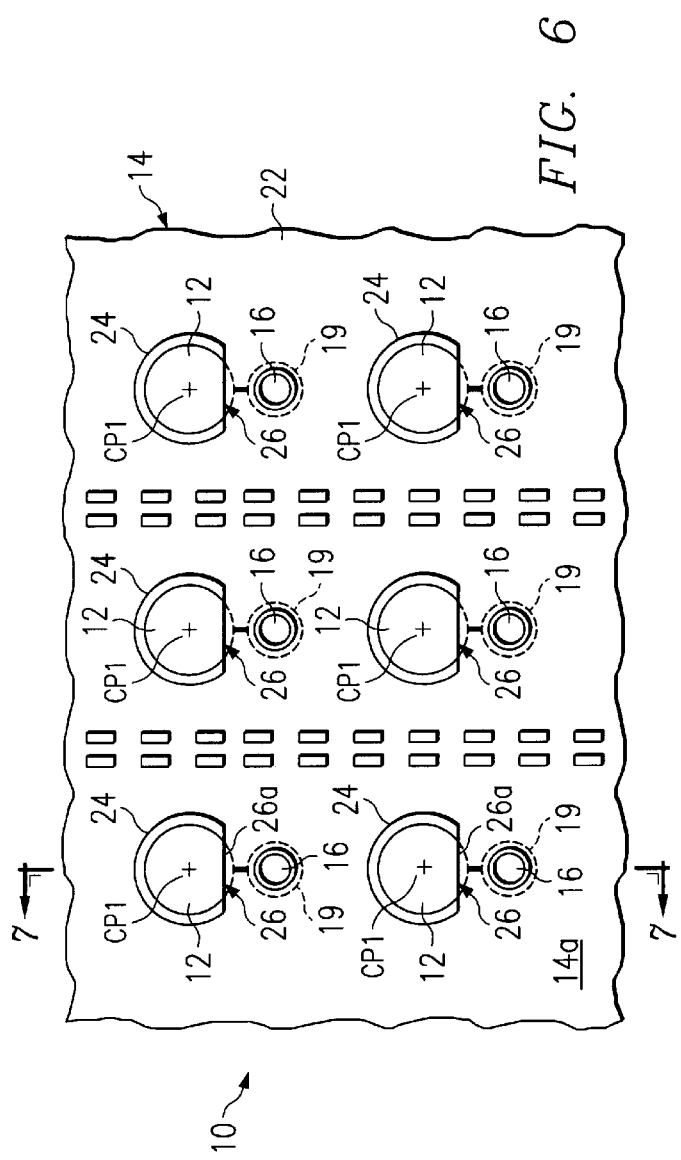
FIG. 6 is a plan view illustrating an embodiment of a solder mask layer formed on the circuit assembly of FIG. 3.
Figure 7:
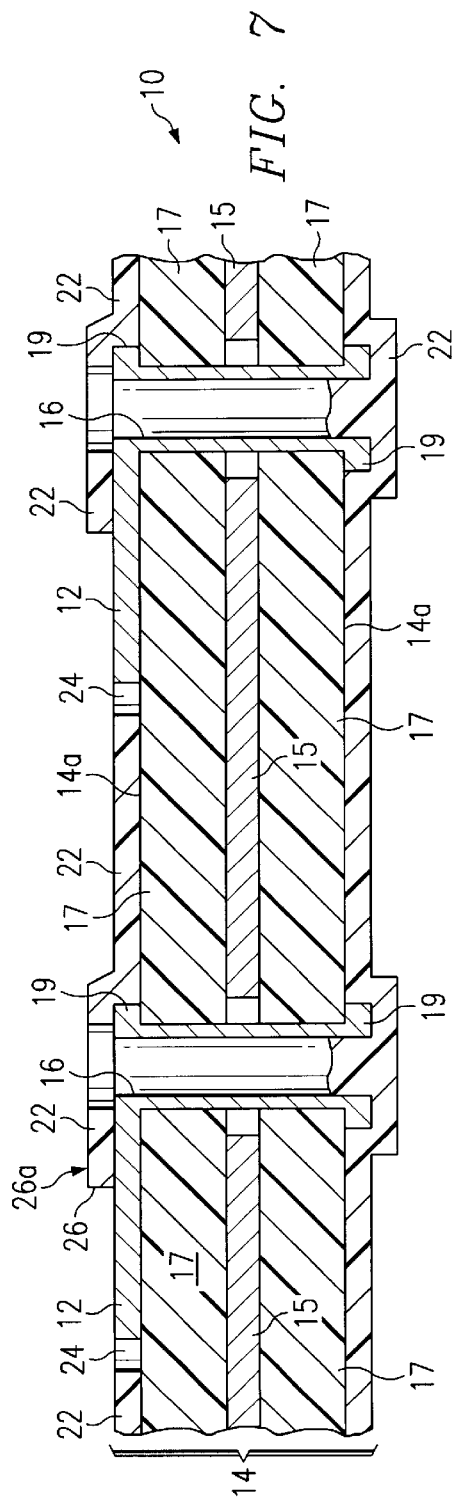
FIG. 7 is a cross sectional view taken along the line 7—7 in FIG. 6.

Referring to FIGS. 6 and 7, a solder mask layer 22 is formed on each major surface 14a of the circuit substrate 14. The solder mask layer 22 on the major surface 14a carrying the interconnect pads 12 is patterned to include a plurality of openings 24 therein with each interconnect pad 12 exposed within a respective one of the openings 24.

The solder mask layer 22 extends over a portion of each interconnect pad 12 and over at least a portion of each conductive land 19. The solder mask layer 22 on the major surface 14a opposite the interconnect pads 12 is typically non-patterned. In some applications, the solder mask layer 22 may be formed on only one of the major surfaces 14a of the circuit substrate 14.

Each one of the openings 24 in the solder mask layer 22 has a generally round shape with a truncated edge segment 26, FIG. 6. Each truncated edge segment 26 is positioned between the respective interconnect pad 12 and the connected conductive via 16. Each truncated edge segment 26 defines a transverse edge 26a of the solder mask layer 22 that is offset from a perimeter edge of the respective interconnect pad 12 toward the respective center point CP1.

Another key aspect of the printed circuit assembly 10 is that the openings 24 are patterned to include the truncated edge segments 26. Each truncated edge segment 26 provides an increased distance between the exposed portion of each interconnect pad 12 and the conductive land 19 of the connected conductive via 16. The increased distance reduces the potential for a flowable conductive material, such as solder from a solder ball (not shown), to wick into the conductive vias 16 during a solder reflow process.

The printed circuit assembly 10 can be manufactured by contract manufacturers such as Compeq Manufacturing Company, Ltd. and HADCO Corporation using conventional manufacturing techniques. Furthermore, the printed circuit assembly 10 can be manufactured from commercially available materials. A preferred material for the dielectric layers 17 is a flame retardant fully cured epoxy resin commonly referred to as FR-4. A preferred material for the conductive layers 15 is copper.

Figure 8:
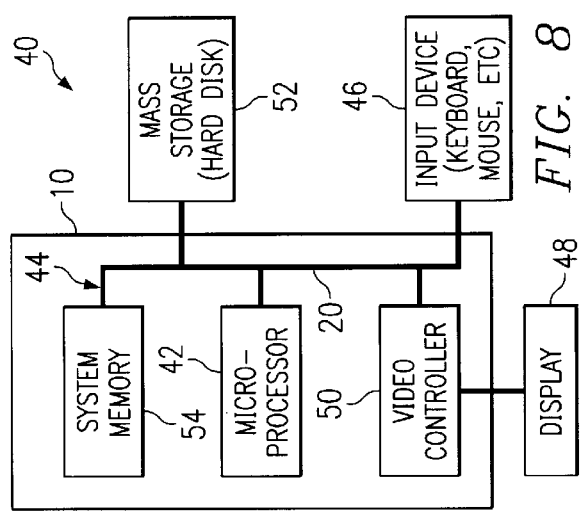
FIG. 8 is a block diagram view illustrating an embodiment of a computer system having one or more system components mounted on a printed circuit assembly.

An embodiment of a computer system 40 is illustrated in FIG. 8. The computer system 40 includes at least one microprocessor 42. The microprocessor 42 is connected to a bus 44. The bus 44 serves as a connection between the microprocessor 42 and other components of the computer system 40. The bus 44 typically includes one or more traces such as the routing traces 20 discussed above. An input device 46 is coupled to the microprocessor 42 to provide input to the microprocessor 42. Examples of input devices include keyboards, touchscreens, and pointing devices such as a mouse, a trackball and a trackpad. The computer system 40 may also include a display 48, which is coupled to the microprocessor 42 typically by a video controller 50. Programs and data are stored on a mass storage device 52 which is coupled to the microprocessor 42. Mass storage devices include components such as hard disks, optical disks, magneto-optical drives, floppy drives, and the like. A system memory 54 provides the microprocessor 42 with fast storage to facilitate execution of computer programs by the microprocessor 42. The microprocessor 42, video controller 48 and system memory 54 are mounted on a printed circuit assembly 10, as discussed above. It should be understood that other busses and intermediate circuits can be employed between the components described above and microprocessor 42 to facilitate interconnection between the components and the microprocessor 42.

Figure 9:
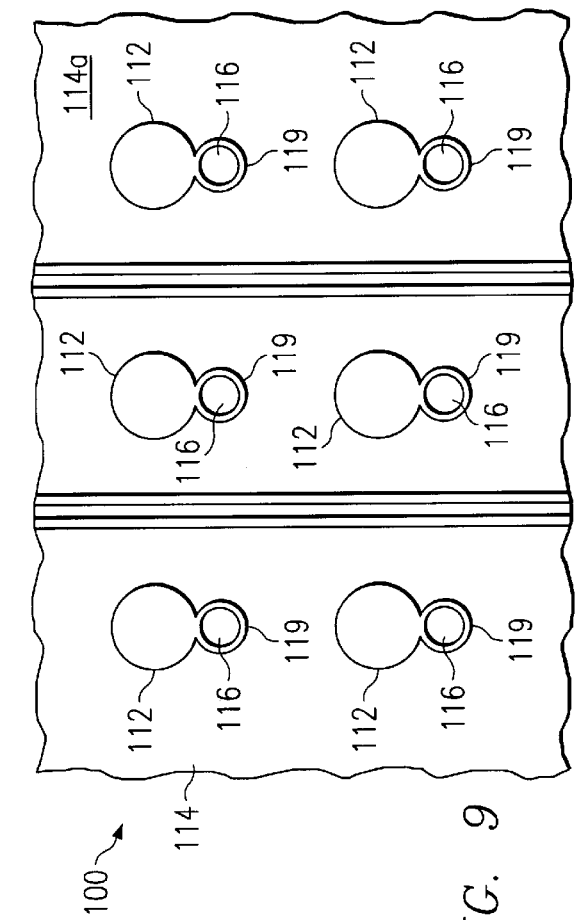
FIG. 9 is a plan view illustrating an embodiment of a printed circuit assembly having an array of conductive vias that is in-line, offset and integrally formed relative to an array of interconnect pads.

Referring to FIG. 9, a printed circuit assembly 100 includes a plurality of interconnect pads 112 on a major surface 114a of a circuit substrate 114. A plurality of conductive vias 116 extend through the circuit substrate 114. Each conductive via 116 includes a conductive land 119 that is integral with and substantially tangent to a connected one of the interconnect pads 112. Accordingly, a trace for electrically connecting each conductive via 116 with the connected interconnect pad 112 is not required.

As a result, one embodiment of a printed circuit assembly includes a circuit substrate having spaced apart first and second major surfaces. A first and a second interconnect pad are spaced apart on the first major surface of the circuit substrate. The first and the second interconnect pads are positioned on a reference axis. The first interconnect pad is spaced apart from the second interconnect pad by a first distance. A first and a second conductive via extend through the circuit substrate between the first and the second major surfaces. The first and the second conductive vias are positioned adjacent to and electrically connected to respective ones of the interconnect pads. Each one of the conductive vias is positioned on the reference axis and is spaced apart from the respective interconnect pad by a second distance. The first distance is substantially greater than the second distance wherein each conductive via is offset toward the connected interconnect pad.

Another embodiment provides a computer system including a microprocessor and a system memory coupled to provide storage to facilitate execution of computer programs by the microprocessor. An input is coupled to provide input to the microprocessor. A display is coupled to the microprocessor by a video controller and a mass storage is coupled to the microprocessor. A printed circuit board is electrically coupled to the microprocessor. The printed circuit board includes a circuit substrate having two spaced apart major surfaces and a plurality of rows of interconnect assemblies. Each row of interconnect assemblies includes a first and a second interconnect pad spaced apart on a major surface of the circuit substrate. The first and the second interconnect pads are positioned on a respective reference axis. The first interconnect pad is spaced apart from the second interconnect pad by a first distance. A first and a second conductive via extend through the circuit substrate. The first and the second conductive vias are positioned adjacent to and electrically connected to respective ones of the interconnect pads. Each one of the conductive vias is positioned on the respective reference axis and is spaced apart from the respective interconnect pad by a second distance. The first distance is substantially greater than the second distance wherein each conductive via is offset toward the connected interconnect pad.

A further embodiment provides a method of providing increased routing space on a major surface of a printed circuit assembly. The method includes forming a first and a second interconnect pad spaced apart on a major surface of a circuit substrate. The first and the second interconnect pads are positioned on a reference axis with the first interconnect pad spaced apart from the second interconnect pad by a first distance. A first and a second conductive via are formed through the circuit substrate. The first and the second conductive vias are positioned on the reference axis adjacent to respective ones of the interconnect pads with each conductive via spaced apart from the respective interconnect pad by a second distance. The second distance is substantially less than the first distance wherein each conductive via is offset toward the respective interconnect pad. Lastly, each conductive via is connected to the respective interconnect pad.

As it can be seen, the embodiments disclosed herein provide several advantages. An array of conductive vias and interconnect pads can be configured to provide increased space for routing traces therethrough. The printed circuit assemblies can be cost-effectively manufactured using conventional manufacturing techniques. The potential for shorting between adjacent conductive features is significantly reduced. The uninterrupted web area of interior conductive layers is substantially increased. The impedance of conductive features such as routing traces is more controlled.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A printed circuit assembly, comprising:
   a circuit substrate having spaced apart first and second major surfaces;
   a plurality of rows of interconnect assemblies on the substrate;
   a first and a second interconnect pad on the first major surface of the circuit substrate, the first and the second interconnect pads positioned on a reference axis extending therebetween;
   each interconnect pad having a pad diameter;
   a conductive via positioned between each interconnect pad, the conductive via being electrically connected to and offset toward the first one of the interconnect pads, the conductive via having a center on the reference axis;
   a first directional pitch extending between adjacent pads in one row and a second directional pitch extending between adjacent pads in adjacent rows;
   the rows being spaced apart to define a trace routing width;
   the trace routing width being equal to the second directional pitch minus the pad diameter;
   a trace extending between a first row and a second row on the interconnect assemblies; and
   the first row of interconnect assemblies being spaced apart from the second row of interconnect assemblies by a distance of about 25 mils and wherein the trace has a width of about 18 mils.

2. The printed circuit assembly of claim 1, further comprising:
   a conductive trace electrically connected between each conductive via and the respective interconnect pad.

3. The printed circuit assembly of claim 1 wherein each conductive via is integrally formed with the respective interconnect pad.

4. The printed circuit assembly of claim 1 wherein the circuit substrate includes a plurality of spaced apart dielectric layers and at least one interior conductive layer therebetween, a first one of the dielectric layers defining the first major surface of the circuit substrate and a second one of the dielectric layers defining the second major surface of the circuit substrate.

5. The printed circuit assembly of claim 1, further comprising:
   a solder mask layer on the circuit substrate, the solder mask layer having openings therein and each interconnect pad being exposed within a respective one of the openings.

6. The printed circuit assembly of claim 5 wherein each one of the openings in the solder mask layer has a generally round shape with a truncated edge segment, the truncated edge segment of each opening positioned between the respective interconnect pad and conductive via.

7. The printed circuit assembly of claim 6 wherein the truncated edge segment of each one of the openings defines a transverse edge of the solder mask layer, each transverse edge being offset from a perimeter edge of the respective interconnect pad.

8. The printed circuit assembly of claim 6 wherein each conductive via includes a conductive land on each major surface of the circuit substrate, each interconnect pad being integral with the respective conductive land of the connected conductive via, and the solder mask layer being formed on a portion of each conductive land.

9. The printed circuit assembly of claim 1 wherein each conductive via includes a conductive land on each major surface of the circuit substrate, each interconnect pad being integral with the respective conductive land of the connected conductive via.

10. The printed circuit assembly of claim 9 wherein the interconnect pads and the conductive lands of each conductive via are substantially round, and wherein each interconnect pad is substantially tangent to the respective conductive land of the connected conductive via.

11. A computer system, comprising:
    a microprocessor;
    a mass storage coupled to the microprocessor; and
    a printed circuit board electrically coupled to the microprocessor, the printed circuit board including a circuit substrate having two spaced apart major surfaces and a plurality of rows of interconnect assemblies, each row of interconnect assemblies including:
       a first and a second interconnect pad on a major surface of the circuit substrate, the first and the second interconnect pads positioned on a respective reference axis extending therebetween;
       each interconnect pad having a pad diameter;
       a conductive via positioned between each interconnect pad, the conductive via being electrically connected to and offset toward the first one of the interconnect pads, the conductive via having a center on the reference axis;

a first directional pitch extending between adjacent pads in one row and a second directional pitch extending between adjacent pads in adjacent rows;

the rows being spaced apart to define a trace routing width;

the trace routing width being equal to the second directional pitch minus the pad diameter;

a trace extending between a first row and a second row on the interconnect assemblies; and the first row of interconnect assemblies being spaced apart from the second row of interconnect assemblies by a distance of about 25 mils and wherein the trace has a width of about 18 mils.

12. A method of providing increased routing space on a major surface of a printed circuit assembly, comprising the steps of:

forming a plurality of rows of first and a second interconnect pads on a major surface of a circuit substrate with the first and the second interconnect pads positioned on a reference axis extending therebetween, each pad having a pad diameter;

positioning a conductive via between each interconnect pad such that the conductive via has a center on the reference axis;

electrically connecting the conductive via to the first one of the interconnect pads;

offsetting the conductive via toward the first one of the interconnect pads;

extending a first directional pitch between adjacent pads in one row and extending a second directional pitch between adjacent pads in adjacent rows;

spacing the rows apart to define a trace routing width which is equal to the second directional pitch minus the pad diameter;

extending a trace between a first row and a second row on the interconnect assemblies;

spacing the first row from the second row by a distance of about 25 mils; and providing the trace to have a width of about 18 mils.

13. The method of claim 12 wherein forming the interconnect pads and the conductive vias includes:

forming the interconnect pads and forming the conductive vias to have a substantially round shape wherein the round shade defines a respective center point thereof; and positioning the center point of each interconnect pad and the center point of each conductive via on the reference axis.

14. The method of claim 12 wherein connecting each conductive via to the respective interconnect pad includes electrically connecting a conductive trace between each conductive via and the respective interconnect pad.

15. The method of claim 12, further comprising:

forming a solder mask layer on the circuit substrate; and forming openings in the solder mask layer wherein each interconnect pad is exposed within a respective one of the openings.

16. The method of claim 15 wherein forming openings includes forming generally round shaped openings each having a truncated edge segment wherein each truncated edge segment is positioned on the respective interconnect pad adjacent to the connected conductive via.

17. A printed circuit assembly, comprising:

a circuit substrate having spaced apart first and second major surfaces;

a plurality of rows of interconnect assemblies on the substrate;

a first and a second interconnect pad on the first major surface of the circuit substrate, the first and the second interconnect pads positioned on a reference axis extending therebetween;

each interconnect pad having a pad diameter;

a conductive via positioned between each interconnect pad, the conductive via being electrically connected to and offset toward the first one of the interconnect pads, the conductive via having a center on the reference axis;

a first directional pitch extending between adjacent pads in one row and a second directional pitch extending between adjacent pads in adjacent rows;

the rows being spaced apart to define a trace routing width;

the trace routing width being equal to the second directional pitch minus the pad diameter;

a trace extending between a first row and a second row on the interconnect assemblies; and the first row being spaced apart from the second row by a distance of about 25 mils, and wherein the trace has a width of about 75% of the distance between the first row and the second row.

* * * * *